(12) United States Patent
Sun et al.

(10) Patent No.: US 11,031,279 B2
(45) Date of Patent: Jun. 8, 2021

(54) SEMICONDUCTOR DEVICE WITH REDUCED TRENCH LOADING EFFECT

(71) Applicant: Taiwan Semiconductor Manufacturing Co., Ltd., Hsinchu (TW)

(72) Inventors: Chia-Kai Sun, Hsinchu (TW); Yi-Wei Chiu, Kaohsiung (TW); Hung Jui Chang, Changhua County (TW); Chia-Ching Tsai, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 54 days.

(21) Appl. No.: 15/672,123

(22) Filed: Aug. 8, 2017

(65) Prior Publication Data

US 2018/0166321 A1    Jun. 14, 2018

Related U.S. Application Data

(60) Provisional application No. 62/434,133, filed on Dec. 14, 2016.

(51) Int. Cl.
*H01L 21/768*    (2006.01)
*H01L 21/762*    (2006.01)
(Continued)

(52) U.S. Cl.
CPC .. *H01L 21/76224* (2013.01); *H01L 21/28088* (2013.01); *H01L 21/3065* (2013.01); *H01L 21/3086* (2013.01); *H01L 21/31116* (2013.01); *H01L 21/31144* (2013.01); *H01L 21/762* (2013.01); *H01L 21/768* (2013.01); *H01L 21/76229* (2013.01); *H01L 21/76816* (2013.01); *H01L 29/4236* (2013.01); *H01L 29/517* (2013.01); *H01L 21/311* (2013.01)

(58) Field of Classification Search
CPC ............. H01L 21/0332; H01L 21/0334; H01L 21/76229; H01L 21/76801–76804; H01L 21/76816; H01L 21/311–31144
See application file for complete search history.

(56) References Cited

U.S. PATENT DOCUMENTS 5,152,834 A * 10/1992 Allman ............... H01L 21/3122
106/287.13
5,821,163 A * 10/1998 Harvey ............ H01L 21/31116
438/631

(Continued)

FOREIGN PATENT DOCUMENTS

KR    10-2015-0014387    2/2015

*Primary Examiner* — Bryan R Junge
(74) *Attorney, Agent, or Firm* — Sterne, Kessler, Goldstein & Fox P.L.L.C.

(57) ABSTRACT

The present disclosure relates to a semiconductor device and a manufacturing method, and more particularly to a semiconductor device having reduced trench loading effect. The present disclosure provides a novel multi-layer cap film incorporating one or more oxygen-based layers for reducing trench loading effects in semiconductor devices. The multi-layer cap film can be made of a metal hard mask layer and one or more oxygen-based layers. The metal hard mask layer can be formed of titanium nitride (TiN). The oxygen-based layer can be formed of tetraethyl orthosilicate (TEOS).

20 Claims, 7 Drawing Sheets

(51) Int. Cl.
  *H01L 21/3065* (2006.01)
  *H01L 21/308* (2006.01)
  *H01L 29/423* (2006.01)
  *H01L 21/28* (2006.01)
  *H01L 29/51* (2006.01)
  *H01L 21/311* (2006.01)

(56) References Cited

U.S. PATENT DOCUMENTS

| | | |
|---|---|---|
| 8,809,185 B1 | 8/2014 | Feurprier |
| 2001/0041444 A1* | 11/2001 | Shields ............... H01L 21/0276 438/689 |
| 2001/0046781 A1* | 11/2001 | Nakagawa ........ H01L 21/76804 438/725 |
| 2004/0023499 A1* | 2/2004 | Hellig ............... H01L 21/76816 438/694 |
| 2004/0106283 A1* | 6/2004 | Wu ....................... B24B 37/042 438/689 |
| 2008/0119054 A1* | 5/2008 | Nambu ............. H01L 21/31116 438/700 |
| 2008/0265416 A1 | 10/2008 | Lee et al. |
| 2009/0042053 A1* | 2/2009 | Lin ..................... H01L 21/3105 428/613 |
| 2010/0022091 A1* | 1/2010 | Li ..................... H01J 37/32449 438/706 |
| 2012/0244711 A1* | 9/2012 | Yin ..................... H01L 21/0337 438/703 |
| 2012/0329272 A1* | 12/2012 | Arnold ............... H01L 21/0273 438/653 |
| 2013/0109174 A1* | 5/2013 | Grasshoff ......... H01L 21/76811 438/675 |
| 2014/0273441 A1* | 9/2014 | Kim ..................... H01L 21/283 438/666 |
| 2015/0028483 A1* | 1/2015 | Zhou ................. H01L 21/76841 257/762 |
| 2017/0256449 A1* | 9/2017 | Zhang ............... H01L 21/76802 |

* cited by examiner

SEMICONDUCTOR DEVICE WITH REDUCED TRENCH LOADING EFFECT

This application claims the benefit of U.S. Provisional Patent Application No. 62/434,133, titled "Semiconductor Device with Reduced Trench Loading Effect," which was filed on Dec. 14, 2016 and is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
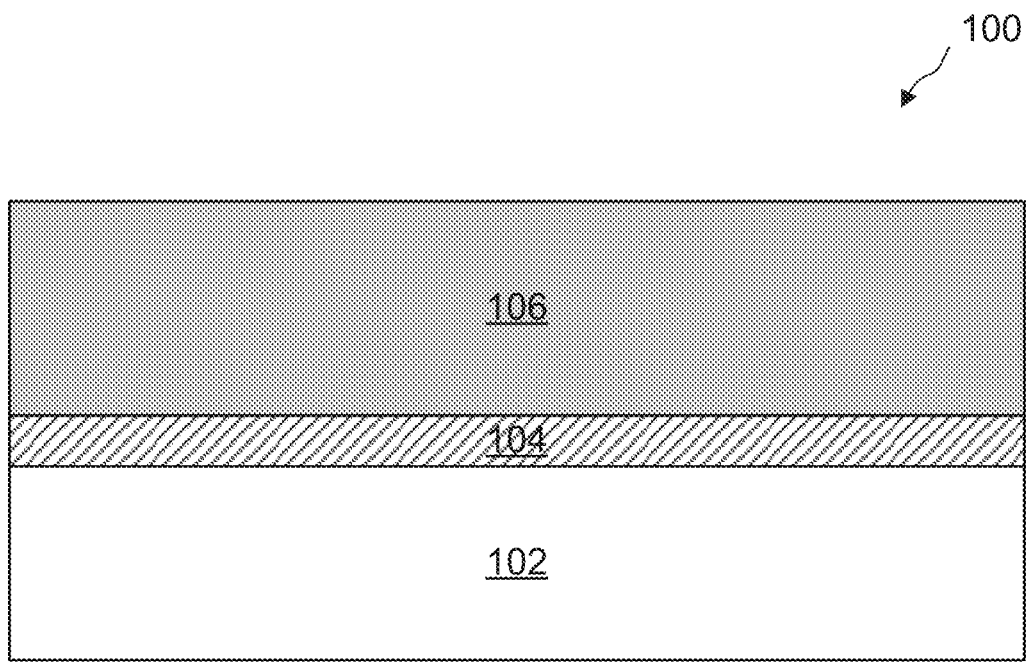
FIG. 1 is a cross-sectional view of a semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "substantially" as used herein indicates the value of a given quantity varies by ±5% of the value.

The term "about" as used herein indicates the value of a given quantity varies by ±10% of the value.

As technologies progress, integrated circuits (ICs) are characterized by decreasing dimension requirements over previous generation devices. However, there are challenges to implementing such features and processes. As the gate length and spacing between devices decrease, the trench loading effect is exacerbated across devices with different critical dimensions or pattern densities and results in different etching depths.

The trench loading effect can be derived from etching rate variances across a semiconductor device due to different patterning (e.g., pattern density, aspect ratio of features, and/or composition/reflectivity of features).

Various embodiments in accordance with this disclosure provide methods of forming a multi-layer cap film made of a metal hard mask layer and one or more oxygen-based layers. The metal hard mask layer can be formed of, for example, titanium nitride (TiN). The oxygen-based layer can be formed of, for example, tetraethyl orthosilicate (TEOS).

The multi-layer cap film incorporating oxygen-based layers can be implemented to reduce the etching rate variances. The multi-cap layer releases oxygen ions during, for example, plasma etching processes. The oxygen ions can reduce the trench loading effect by varying the etching rates of dielectric material in areas with different patterns. Oxygen ions diffused from the oxygen-based layers can enhance the plasma etching rate of dielectric material.

FIGS. 1-8 provide various views of a semiconductor device fabrication process that illustrate a reduced trench loading effect. The fabrication process can incorporate multi-layer cap films that include oxygen-based layers. The fabrication processes provided herein are exemplary, and alternative processes in accordance with this disclosure may be performed that are not shown in these figures.

FIG. 1 is a cross-sectional view of semiconductor structure 100, in accordance with some embodiments of the present disclosure.

Semiconductor structure 100 includes a substrate 102, an etch stop layer 104, and a dielectric layer 106. Substrate 102 can be a silicon substrate, according to some embodiments. In some embodiments, substrate 102 can be (i) another semiconductor, such as germanium; (ii) a compound semiconductor including silicon carbide, gallium arsenide, gallium phosphide, indium phosphide, indium arsenide, gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), and/or indium antimonide; (iii) an alloy semiconductor including silicon germanium (SiGe); or (iv) combinations thereof. In some embodiments, substrate 102 can be a semiconductor on insulator (SOI). In some embodiments, substrate 102 can be an epitaxial material.

In some embodiments, etch stop layer 104 is formed on substrate 102 and can be used to prevent the etching of substrate 102. The composition of etch stop layer 104 can be silicon nitride. Other exemplary compositions include silicon oxynitride ($SiO_xN_y$), TiN, and/or other suitable materials. The deposition of etch stop layer 104 can be done by any suitable processes such as, for example, chemical vapor deposition (CVD) physical vapor deposition (PVD), atomic layer deposition (ALD), molecular beam epitaxy (MBE), high density plasma CVD (HDPCVD), metal organic (MOCVD), remote plasma CVD (RPCVD), plasma-enhanced CVD (PECVD), plating, other suitable methods, and/or combinations thereof.

Dielectric layer 106 is made of a dielectric material and can be formed of silicon oxide, spin-on-glass, silicon nitride, silicon oxynitride, fluorine-doped silicate glass (FSG), a low-k dielectric material, and/or other suitable insulating material. In some embodiments, the thickness of dielectric layer 106 can be in a range of about 500 angstroms to about 700 angstroms. In some embodiments, the thickness of dielectric layer 106 is greater than about 700 angstroms. The deposition of dielectric layer 106 can be done by any suitable processes such as, for example, CVD, PVD, ALD, MBE, HDPCVD, MOCVD, RPCVD, PECVD, other suitable methods, and/or combinations thereof. In some embodiments, semiconductor structure 100 can include capping layers, other etch stop layers, and/or other suitable materials. In some embodiments, semiconductor structure 100 can also include a processed integrated circuit wafer containing such as, for example, a plurality of transistors configured to be complementary metal-oxide-semiconductor (CMOS) circuits. These circuits can include logic, analog, RF (radio-frequency) parts made out of a variety of transistors, capacitors, resistors and interconnections, and are not shown in FIG. 1 for simplicity. In some embodiments, the semiconductor structure includes raised features such as, for example, fins. Fins can be fabricated using suitable processes including photolithography and etch processes.

Figure 2:
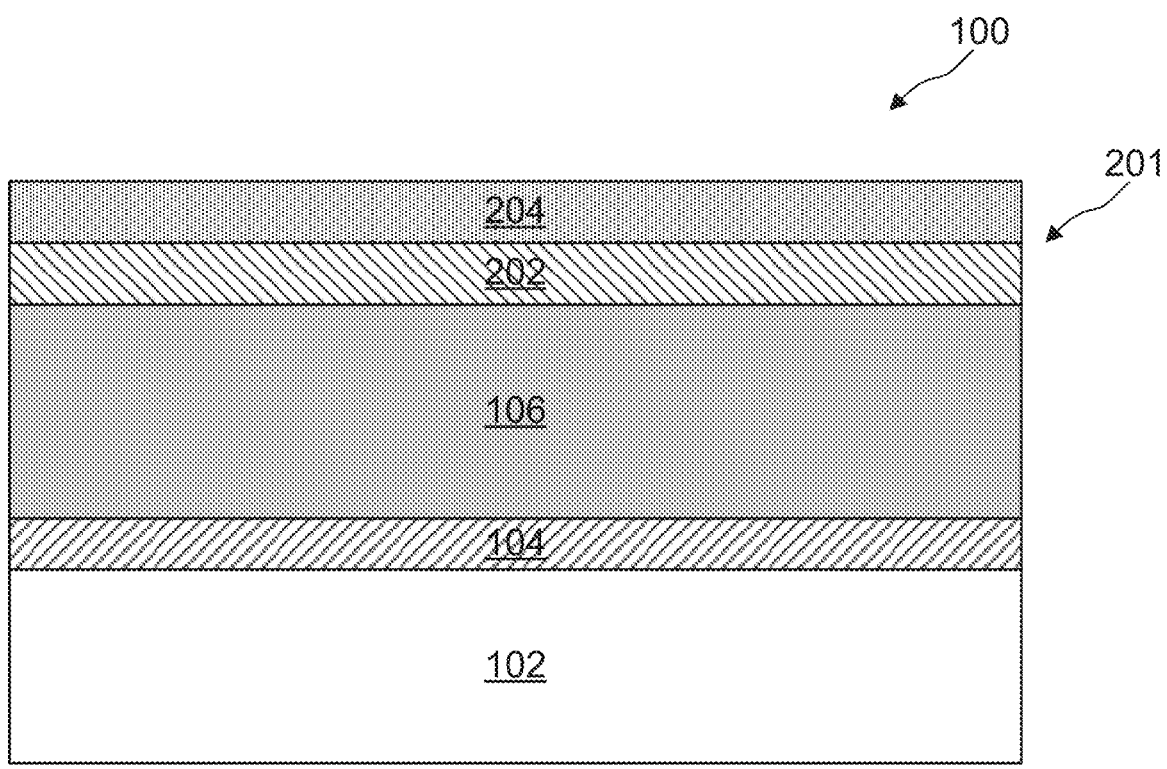
FIG. 2 is a cross-sectional view of a semiconductor structure after depositing a multi-layer cap film, in accordance with some embodiments.

FIG. 2 is a cross-sectional view of semiconductor structure 100 after depositing a multi-layer cap film, in accordance with some embodiments of the present disclosure. The multi-layer cap film can include an oxygen-based layer 202 and a metal hard mask layer 204. In some embodiments, the multi-layer cap film can also include other layers which are not shown in FIG. 2 for simplicity. Exemplary composition of oxygen-based layer 202 can include TEOS. Oxygen-based layer 202 can be formed using suitable deposition processes such as, for example, CVD, PVD, ALD, MBE, HDPCVD, MOCVD, RPCVD, PECVD, other suitable methods, and/or combinations thereof. In some embodiments, the thickness of oxygen-based layer 202 is in a range from about 25 angstroms to about 250 angstroms. In some embodiments, the thickness of oxygen-based layer 202 is in a range from about 225 angstroms to 275 angstroms. Exemplary composition of metal hard mask layer 204 can include TiN. Metal hard mask layer 204 can be formed using suitable deposition processes such as, for example, CVD, PVD, ALD, MBE, HDPCVD, MOCVD, RPCVD, PECVD, other suitable methods, and/or combinations thereof. In some embodiments, the thickness of metal hard mask layer 204 is in a range from about 250 angstroms to about 350 angstroms.

FIGS. 3A-5 provide various views of a semiconductor device fabrication process that illustrate reduced trench loading effect in semiconductor structures that include structures with different pattern densities, in accordance with some embodiments of the present disclosure.

Figure 3A:
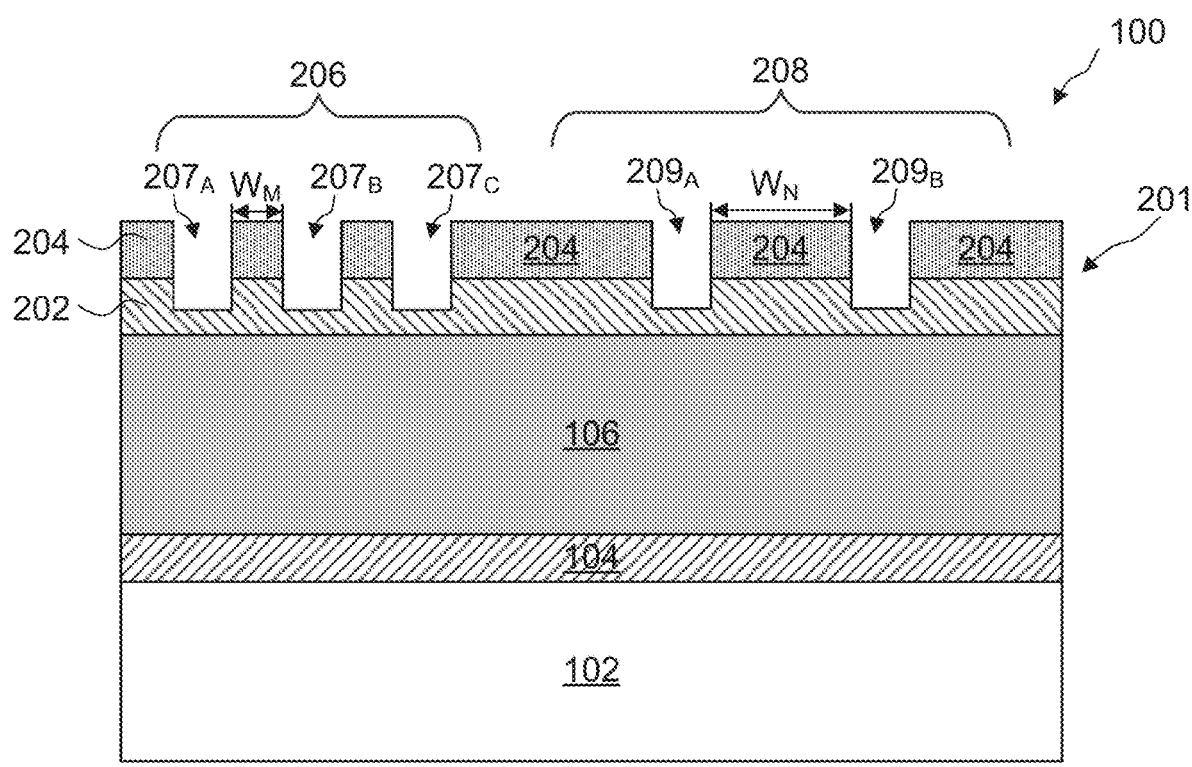
FIGS. 3A-3B are cross-sectional views of a semiconductor structure after patterning a multi-layer cap film, in accordance with some embodiments.
Figure 3B:
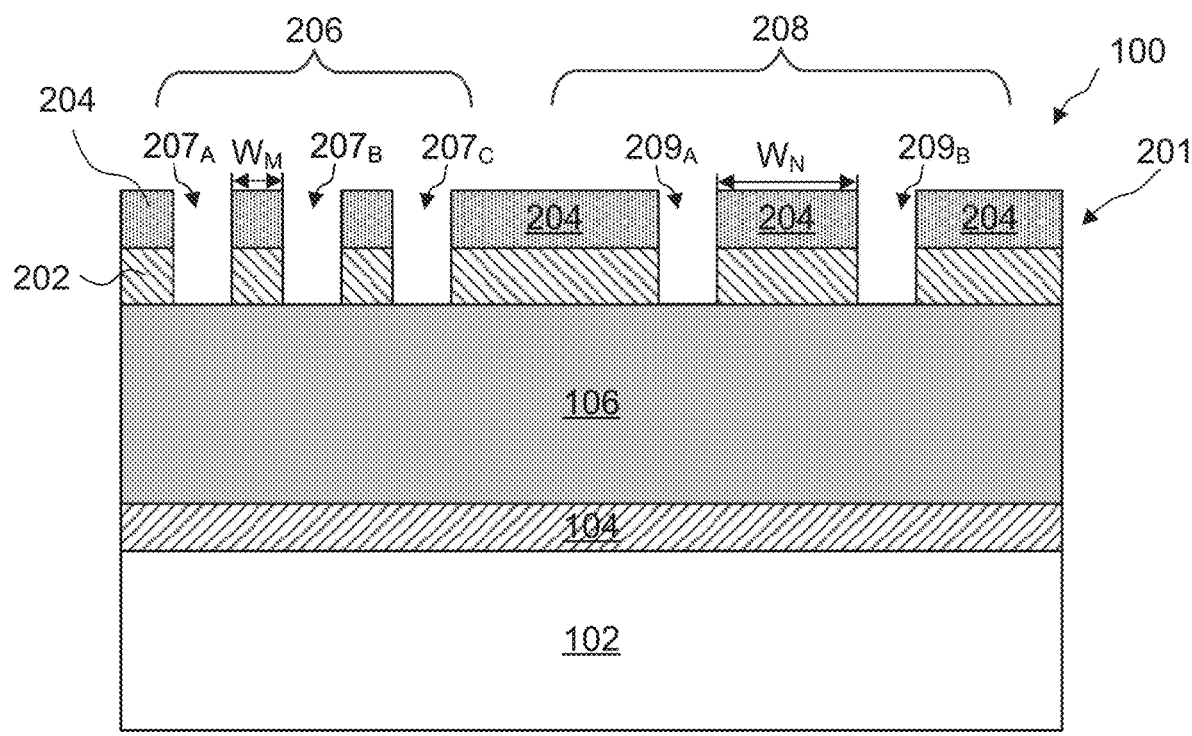

FIGS. 3A-3B are cross-sectional views of semiconductor structure 100 after patterning the multi-layer cap film 201, in accordance with some embodiments of the present disclosure. The etching of multi-layer cap film 201 can include depositing a photoresist material on metal hard mask 204, exposing and patterning the photoresist to expose the portions of metal hard mask 204 to be etched, and etching the exposed portions of metal hard mask 204 and the underlying oxygen-based layer 202.

As shown in FIG. 3A, exposed portions of metal hard mask 204 not protected by the photoresist is etched away and the underlying oxygen-based layer 202 is partially etched away, in accordance with some embodiments. The partial etching of oxygen-based layer 202 can be achieved by over etching metal hard mask 204. As shown in FIG. 3B, the exposed portions of metal hard mask 204 and the underlying oxygen-based layer 202 not protected by photoresist are removed, in accordance with some embodiments. The etching process of metal hard mask 204 and oxygen-based layer 202 can include any suitable etching technique such as, for example, dry etching, wet etching, reactive ion etching, and/or other etching methods. Oxygen-based layer 202 and metal hard mask 204 can also be separately removed in multiple steps using suitable processes.

Removing portions of the multi-layer cap film 201 can form a first region 206 and a second region 208 in the remaining multi-layer cap film 201, in accordance with some embodiments. First region 206 and second region 208 include different pattern densities across semiconductor structure 100. In some embodiments, first region 206 can include dense areas (e.g., greater relative pattern density), while second region 208 can include isolated areas (e.g., lower relative pattern density). However, it should be noted that any relative comparison of "dense" and "isolated" is within the scope of the present disclosure.

In some embodiments, first region 206 can be a region of the substrate where one or more features are separated from each other by a minimum design rule spacing such as, for example, a critical dimension of the utilized photolithography process. For example, the width $W_M$ separating adjacent trenches $207_A$, $207_B$, and $207_C$ in first region 206 formed in remaining multi-layer cap film 201 can be less than about 10 nm. In some embodiments, the separation of adjacent trenches $207_A$, $207_B$, and $207_C$ of first region 206 can be in a range from about 10 nm to about 20 nm. It should be noted that the ranges of trench separation in the remaining multi-layer cap film described herein are merely provided as an example and can be selected based on product needs.

In some embodiments, second region 208 can include a region of the semiconductor structure where features are separated from each other by multiple times of a minimum or near-minimum design rule spacing such as, for example, multiple times of a critical dimension. For example, the width $W_N$ separating two adjacent trenches $209_A$ and $209_B$ in second region 208 formed in remaining multi-layer cap film 201 can be approximately 60 nm. In some embodiments, the separation of adjacent trenches $209_A$ and $209_B$ of second region 208 is in a range from about 40 nm to 70 nm. It should be noted that the ranges of trench separation in the remaining multi-layer cap film described herein are merely provided as an example, and can be selected based on product needs.

Figure 4:
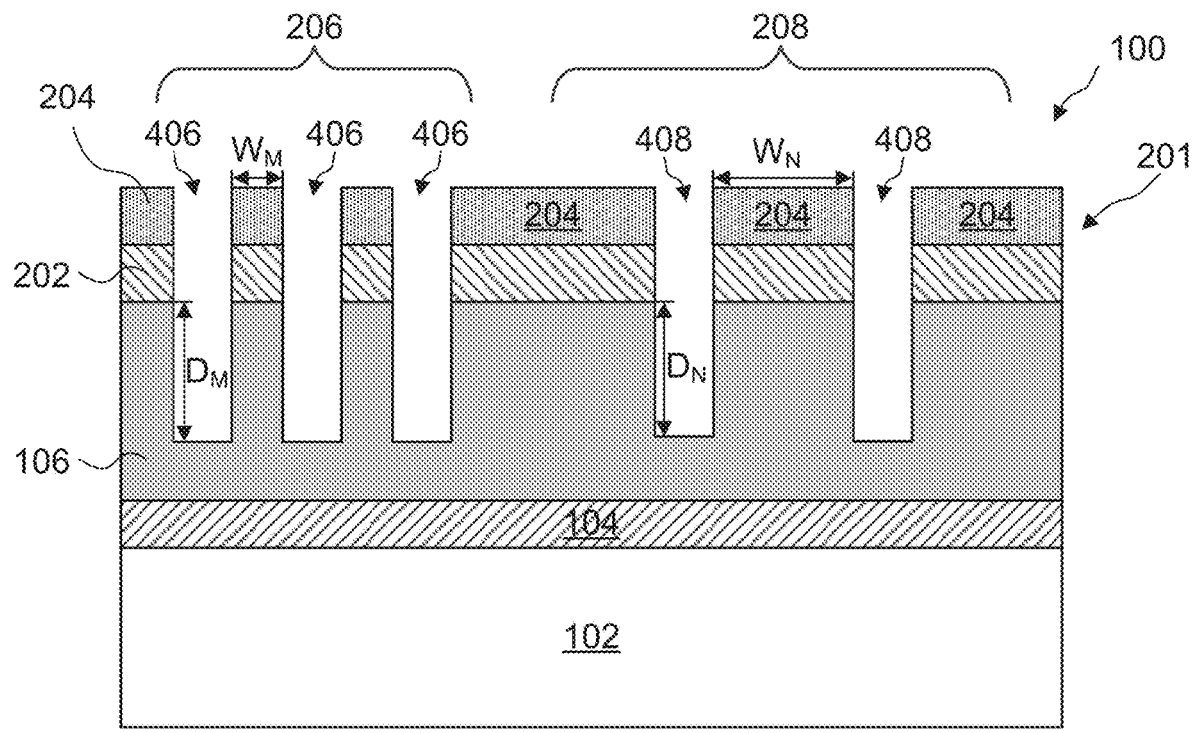
FIG. 4 is a cross-sectional view of a semiconductor structure after etching a dielectric layer using a multi-layer cap film as an etching mask, in accordance with some embodiments.

FIG. 4 is a cross-sectional view of semiconductor structure 100 after etching the dielectric layer using the multi-layer cap film 201 as an etching mask, in accordance with some embodiments of the present disclosure. Portions of dielectric layer 106 that are not protected by metal hard mask 204 and oxygen-based layer 202 are etched to form first recesses 406 in first region 206, and second recesses 408 in second region 208, in accordance with some embodiments. Therefore, the patterns formed by remaining multi-layer cap film 201 can be transferred to dielectric layer 106 by the etching process and form respective first and second recesses 406 and 408. Because the separation between adjacent trenches $207_A$, $207_B$, and $207_C$ has a width of $W_M$, the formed first recesses 406 also has the same width of $W_M$. Similarly, second recesses 408 has a width equal to $W_N$, which is the separation between adjacent trenches $209_A$ and $209_B$. The etching processes can be plasma etching processes such as, for example, a reactive ion etching (RIE) process using oxygen based plasma. In some embodiments, the RIE etching process may include other etchant gas such as, for example, nitrogen, carbon tetrafluoride ($CF_4$), and/or other suitable gases. Numerous other methods to form recesses in dielectric layer 106 can also be suitable.

Incorporating oxygen-based layers can increase the etching rate of dielectric materials. For example, during an RIE process that uses oxygen as the etchant gas, oxygen-based layer 202 can release oxygen ions into the recesses and enhance the plasma etching process, resulting in an increased etching rate of dielectric layer 106. The increase of etching rates is more effective in dense areas such as, for example, first region 206 that has a greater relative pattern density. Without oxygen-based layer 202, the reactive efficiency of RIE etching in dense areas may not be maximized due to insufficient supply of oxygen ions at the etch front. This is because the average number of etchant gas ions available in the recesses of dense areas is statistically less than the average number of etchant gas ions available in the recesses of isolated areas, thus resulting in lower ion density and plasma flux in the former. Incorporating oxygen-based layer 202 releases oxygen ions into recesses 406 during the etching process, thereby increasing the supply of oxygen ions in dense areas. This in turn increases the etching rate of dielectric layer 106 in first recesses 406 of region 206. In FIG. 4, first recesses 406 formed by the etching process can have an etching depth $D_M$ in a range of about 435 angstroms to about 485 angstroms. In some embodiments, the etching depth $D_M$ is greater than about 400 angstroms. In some embodiments, the etching depth $D_M$ is less than about 400 angstroms. It should be noted that the range described herein is provided as an example and the etching depth $D_M$ of first recesses 406 depends on, for example, device specifications and can be adjusted by tuning etch conditions (e.g., etching time, chamber pressure, gas flow rate, plasma power, voltage biases, and/or other suitable parameters).

On the other hand, incorporating oxygen-based layer 202 can also affect etching rates of dielectric material in isolated areas such as, for example, in second region 208 that has a lower relative pattern density. Depending on the structure density and the etching condition, the etching rate can increase, decrease, or remain the same. Without oxygen-based layer 202, in some embodiments where structures in second region 208 are less isolated and may contain insufficient oxygen ions during etching, incorporating oxygen based-layer 202 can increase the etching rate of dielectric layer 106. In contrast, in some embodiments where structures in second region 208 are more isolated and may contain sufficient oxygen ions during etching even without oxygen-based layer 202, incorporating oxygen based-layer 202 may reduce the etching rate of dielectric layer 106 due to excessive supply of oxygen ions. Moreover, in some embodiments, incorporating oxygen-based layer 202 may not have a significant effect on the etching rate of dielectric layers if the structure density is between the above mentioned structure densities.

In FIG. 4, second recesses 408 formed by the etching process can have an etching depth $D_N$ in a range of about 450 angstroms to about 500 angstroms. In some embodiments, the etching depth $D_N$ is greater than about 400 angstroms. In some embodiments, the etching depth $D_N$ is less than about 400 angstroms. It should also be noted that the range described herein is provided as an example and the etching depth $D_N$ of second recesses 408 depends on, for example, device specifications and can be adjusted by tuning etch conditions (e.g., etching time, chamber pressure, gas flow rate, plasma power, voltage biases, and/or other suitable parameters).

As discussed above, incorporating oxygen-based layer 202 can affect etching rates of dielectric material in dense and isolated areas of dielectric layer 106 on semiconductor structure 100. More specifically, the etching rate of dielectric layer 106 can increase in dense areas such as first region 206 and can be similar or equal to the etching rate of dielectric layer 106 in isolated areas such as second region 208. The resulting etching depths ID and $D_N$ of respective recesses 406 and 408 can be substantially equal to each other, in accordance with some embodiments. The difference between resulting etching depths $D_M$ and $D_N$ of respective recesses 406 and 408 can be similar or be less than about 40 angstroms, in accordance with some embodiments. In some embodiments, the difference can be less than about 20 angstroms. In some embodiments, the aspect ratio of the recesses (i.e., depth to width ratio of the recess) can be larger than about 1. In some embodiments, the aspect ratio can be about 10 or about 20. The ranges described herein are provided as examples, and the incorporation of oxygen-based layer 202 can provide similar etching rate of dielectric material in dense and isolated areas, thereby reducing the trench loading effect in semiconductor structure 100.

Figure 5:
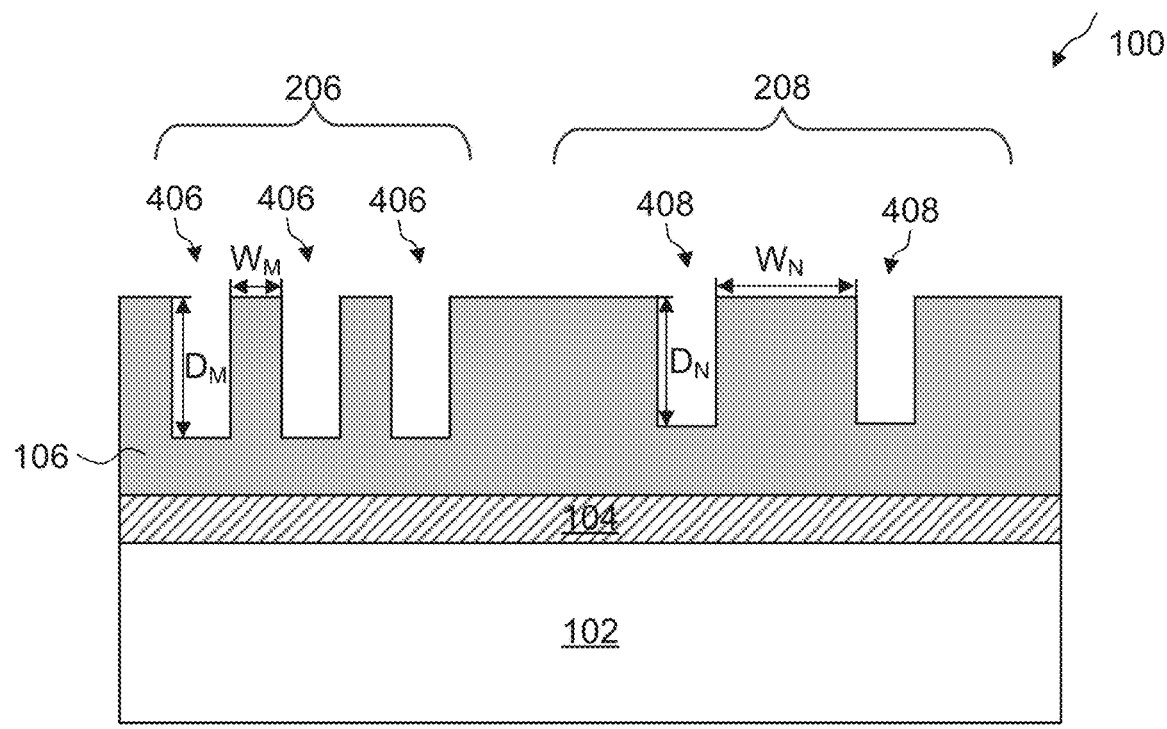
FIG. 5 is a cross-sectional view of a semiconductor structure after removing a multi-layer cap film, in accordance with some embodiments.

FIG. 5 is a cross-sectional view of semiconductor structure 100 after removing multi-layer cap film 201, in accordance with some embodiments of the present disclosure. Oxygen-based layer 202 and metal hard mask layer 206 of multi-layer cap film 201 can be removed using suitable processes such as, for example, dry etching, wet etching, reactive ion etching, and/or other etching methods. Any other suitable methods may alternatively be utilized such as, for example, a chemical mechanical polishing (CMP) process that can also planarize the remaining surfaces of dielectric layer 106.

FIGS. 6A-8 provide various views of a semiconductor device fabrication process that illustrate reduced trench loading effect in semiconductor structures that include structures with different feature sizes, in accordance with some embodiments of the present disclosure.

Figure 6A:
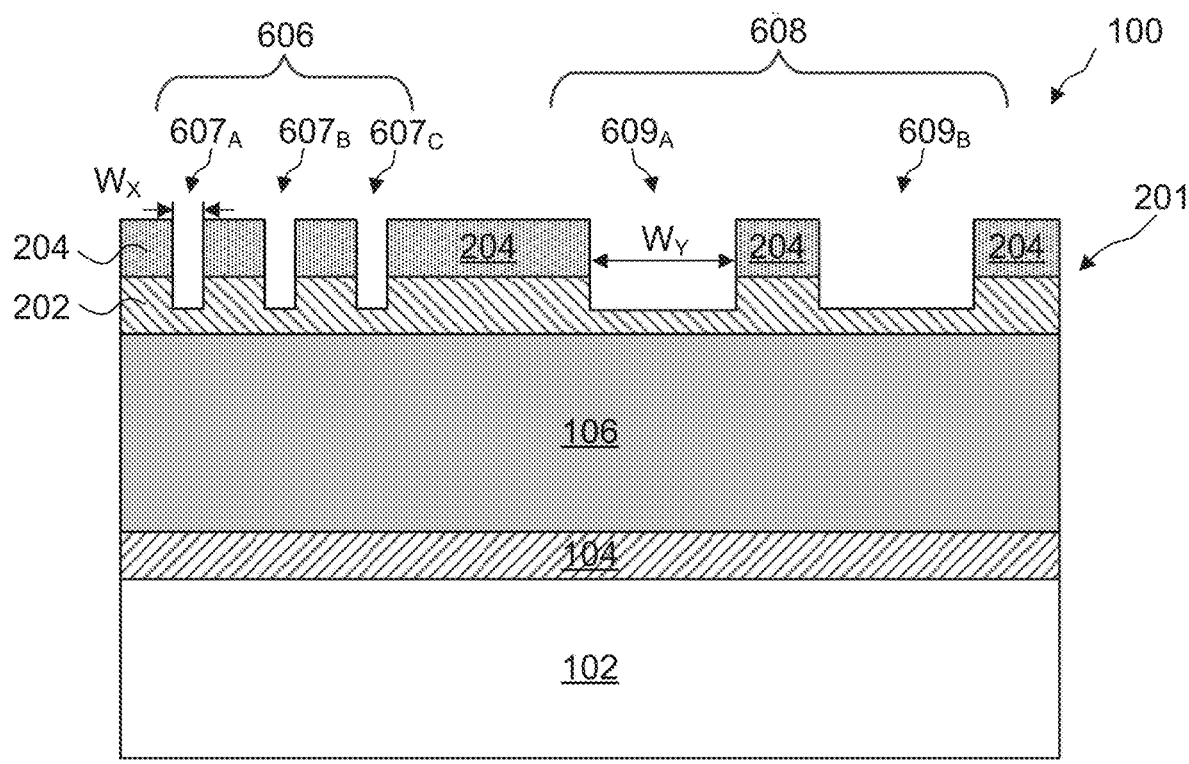
FIGS. 6A-6B are cross-sectional views of a semiconductor structure after patterning a multi-layer cap film, in accordance with some embodiments.
Figure 6B:
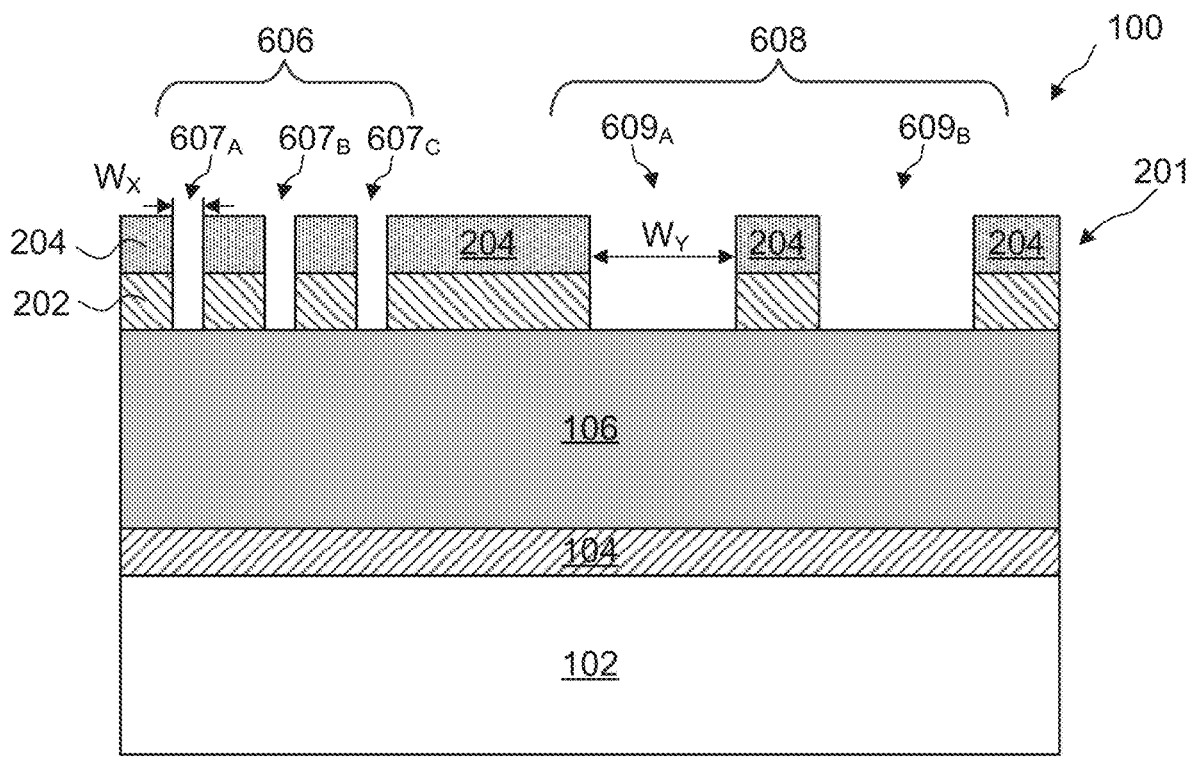

FIGS. 6A-6B are cross-sectional views of semiconductor structure 100 described with reference to FIG. 2 after patterning the multi-layer cap film 201, in accordance with some embodiments of the present disclosure. The etching of multi-layer cap film 201 can include depositing a photoresist material on metal hard mask 204, exposing and patterning the photoresist to expose the portions of metal hard mask 204 to be etched, and etching the exposed portions of metal hard mask 204 and the underlying oxygen-based layer 202.

As shown in FIG. 6A, exposed portions of metal hard mask 204 not protected by the photoresist is etched away and the underlying oxygen-based layer 202 is partially etched away, in accordance with some embodiments. The partial etching of oxygen-based layer 202 can be achieved by over etching metal hard mask 204. As shown in FIG. 6B, the exposed portions of metal hard mask 204 and the underlying oxygen-based layer 202 not protected by photoresist are removed, in accordance with some embodiments. The etching process of metal hard mask 204 and oxygen-based layer 202 can include any suitable etching technique such as, for example, dry etching, wet etching, reactive ion etching, and/or other etching methods. Oxygen-based layer 202 and metal hard mask 204 can also be separately removed in multiple steps using suitable processes.

Removing portions of the multi-layer cap film 201 can form a third region 606 and a fourth region 608 in the remaining multi-layer cap film 201, in accordance with some embodiments. Third region 606 and fourth region 608 include structures with different feature sizes across semiconductor structure 100. In some embodiments, third region 606 can include areas having structures of smaller feature sizes (e.g., structures with smaller width or length), while fourth region 608 can include areas having structures of larger feature sizes (e.g., structures with larger width or length). However, it should be noted that any relative comparisons of "smaller" and "larger" is within the scope of the present disclosure.

In some embodiments, third region 606 can be a region of the semiconductor structure where one or more features have a width or length substantially equal to a minimum design rule spacing such as, for example, a critical dimension of the utilized photolithography process. For example, the width $W_X$ of trenches $607_A$, $607_B$, and $607_C$ in third region 606 formed in remaining multi-layer cap film 201 can be less than about 10 nm. In some embodiments, the widths of trenches $607_A$, $607_B$, and $607_C$ of third region 606 can be in a range from about 10 nm to 20 nm. It should be noted that the ranges of trench widths in the remaining multi-layer cap film described herein are merely provided as an example, and can be selected based on product needs.

In some embodiments, fourth region 608 can include a region of the substrate where features have a width or length that approximately equals to multiple times a minimum or near-minimum design rule spacing such as, for example, multiple times of a critical dimension. For example, the width $W_Y$ of trenches $609_A$ and $609_B$ in fourth region 608 formed in remaining multi-layer cap film 201 can be approximately 60 nm. In some embodiments, the width of trenches $609_A$ and $609_B$ of fourth region 608 is in a range from about 40 nm to 70 nm. In some embodiments, a difference between the widths of trenches $607_A$-$607_C$ and $609_A$-$609_B$ is greater than 40 nm. It should be noted that the ranges of trench widths in the remaining multi-layer cap film described herein are merely provided as an example, and can be selected based on product needs.

Figure 7:
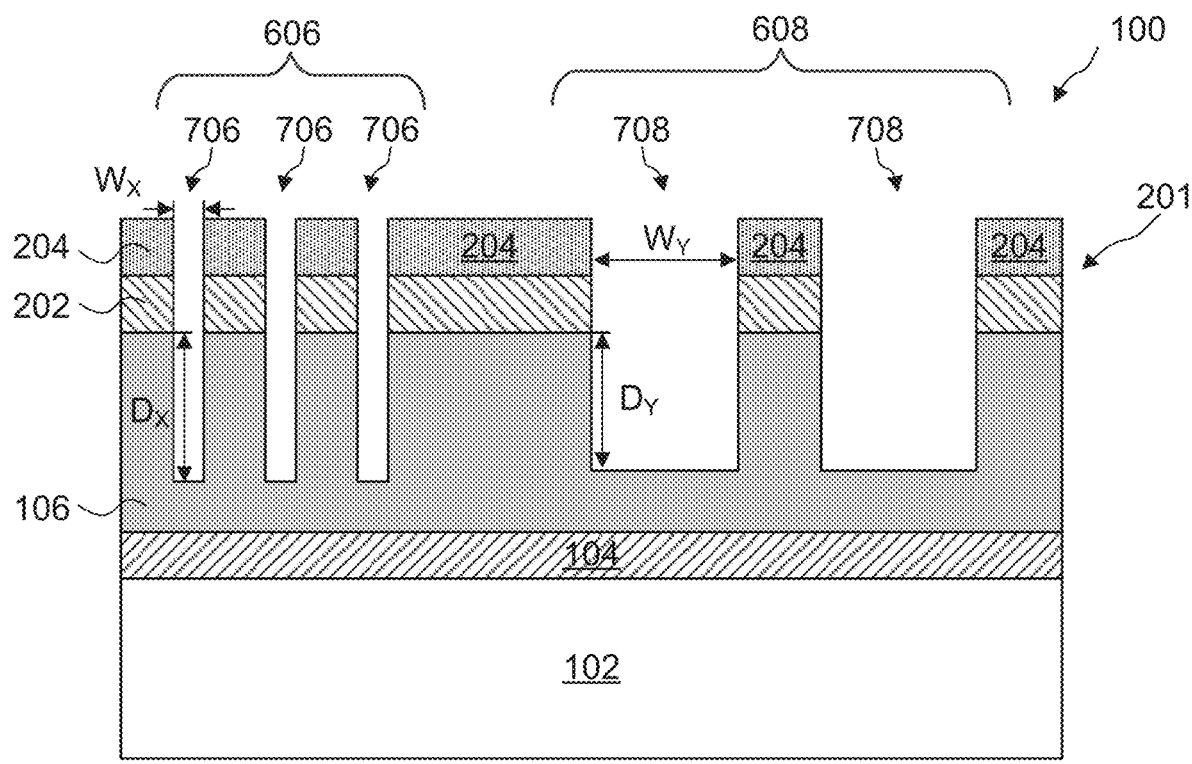
FIG. 7 is a cross-sectional view of a semiconductor structure after etching a dielectric layer using a multi-layer cap film as an etching mask, in accordance with some embodiments.

FIG. 7 is a cross-sectional view of semiconductor structure 100 after etching the dielectric layer using the multi-layer cap film 201 as an etching mask, in accordance with some embodiments of the present disclosure. Portions of dielectric layer 106 that are not protected by metal hard mask 204 and oxygen-based layer 202 are etched to form third recesses 706 in third region 606 and fourth recesses 708 in fourth region 608, in accordance with some embodiments. Therefore, the patterns formed by remaining multi-layer cap film 201 can be transferred to dielectric layer 106 by the etching process and form respective third and fourth recesses 706 and 708. Because recesses $607_A$-$607_C$ have widths of $W_X$, the formed third recesses 706 can also have the same widths of $W_X$. Similarly, the formed fourth recesses 708 can have widths of $W_Y$. The etching processes can be plasma etching processes such as, for example, an RIE process using oxygen based plasma. In some embodiments, the RIE etching process may include other etchant gas such as, for example, nitrogen, $CF_4$, and/or other suitable gases. Numerous other methods to form recesses in dielectric layer 106 can also be suitable.

Incorporating oxygen-based layers can increase the etching rate of dielectric materials, in accordance with some embodiments. For example, during an RIE process that uses oxygen as the etchant gas, oxygen-based layer 202 can release oxygen ions into the recesses and enhance the plasma etching process, resulting in an increased etching rate of dielectric layer 106. The increase of etching rates is more effective in areas having structures with small feature sizes such as, for example, third region 606 where structures have width or length that substantially equals to a minimum or near-minimum design rule spacing. Without oxygen-based layer 202, the reactive efficiency of RIE etching in these areas may not be maximized due to insufficient supply of oxygen ions at the etch front. This is because for structures with a smaller feature size such as, for example, a trench with an opening that equals to a critical dimension, ions of the etchant gas are statistically less likely to enter the opening compared to recesses with a larger feature size. Therefore, the lower ion density and plasma flux in the structures with smaller feature sizes result in a lower etching rate of the dielectric material. However, oxygen ions released from the oxygen-based layer can enhance the plasma etching of dielectric material and improve the etching rate.

Using semiconductor structure 100 in FIG. 7 as an example, incorporating oxygen-based layer 202 releases oxygen ions into the recesses during the etching process, thereby increasing the supply of oxygen ions in areas where structures with feature sizes substantially equal to a minimum or near-minimum design rule spacing. This in turn increases the etching rate of dielectric layer 106 in third recesses 706 of third region 606. In FIG. 7, third recesses 706 formed by the etching process can have an etching depth $D_X$ in a range of about 435 angstroms to about 485 angstroms. In some embodiments, the etching depth $D_X$ is greater than about 400 angstroms. In some embodiments, the etching depth $D_X$ is less than about 400 angstroms. It should be noted that the ranges described herein are provided as examples, and the etching depth $D_X$ of third recesses 706 depends on, for example, device specifications and can be adjusted by tuning etch conditions (e.g., etching time, chamber pressure, gas flow rate, plasma power, voltage biases, and/or other suitable parameters).

On the other hand, incorporating oxygen-based layer 202 can also affect etching rates of dielectric material in areas having structures with large feature sizes such as, for example, fourth region 608 where structures have width or length that substantially equals to multiple times of a minimum or near-minimum design rule spacing. Depending on the structure density and the etching condition, the etching rate can increase, decrease, or remain the same. Without oxygen-based layer 202, in some embodiments where structures in fourth region 608 have smaller feature sizes and may contain insufficient oxygen ions during etching, incorporating oxygen based-layer 202 can increase the etching rate of dielectric layer 106. In contrast, in some embodiments where structures in fourth region 608 have larger feature sizes and may contain sufficient oxygen ions during etching even without oxygen-based layer 202, and incorporating oxygen based-layer 202 may reduce the etching rate of dielectric layer 106 due to excessive supply of oxygen ions. Moreover, in some embodiments, incorporating oxygen-based layer 202 may not have a significant effect on the etching rate of dielectric layers if the structure density is between the above mentioned structure densities. In FIG. 7, fourth recess 708 formed by the etching process can have an etching depth $D_Y$ in a range of about 450 angstroms to about 500 angstroms. In some embodiments, the etching depth $D_Y$ is greater than about 400 angstroms. In some embodiments, the etching depth $D_Y$ is less than about 400 angstroms. In some embodiments, the aspect ratio of the recesses can be larger than about 1. In some embodiments, the aspect ratio can be about 10 or about 20. It should also be noted that the ranges described herein are provided as examples, and the etching depth $D_Y$ of fourth recess 708 depends on, for example, device specifications and can be adjusted by tuning etch conditions (e.g., etching time, chamber pressure, gas flow rate, plasma power, voltage biases, and/or other suitable parameters).

As discussed above, incorporating oxygen-based layer 202 can affect etching rates of dielectric material in areas of dielectric layer 106 on semiconductor structure 100 that have different feature sizes. More specifically, the etching rate of dielectric layer 106 can be increased in areas such as third region 606 so that it is similar or equal to the etching rate in areas such as fourth region 608. The resulting etching depths $D_X$ and $D_Y$ of respective recesses 706 and 708 can be substantially equal to each other, in accordance with some embodiments. The difference between resulting etching depths $D_X$ and $D_Y$ of respective recesses 706 and 708 can also be less than about 40 angstroms, in accordance with some embodiments. In some embodiments, the difference can be less than about 20 angstroms. The ranges described herein are provided as examples and the incorporation of oxygen-based layer 202 can provide similar etching rate of dielectric material in areas with different structure feature sizes, thereby reducing the trench loading effect in semiconductor structure 100.

Figure 8A:
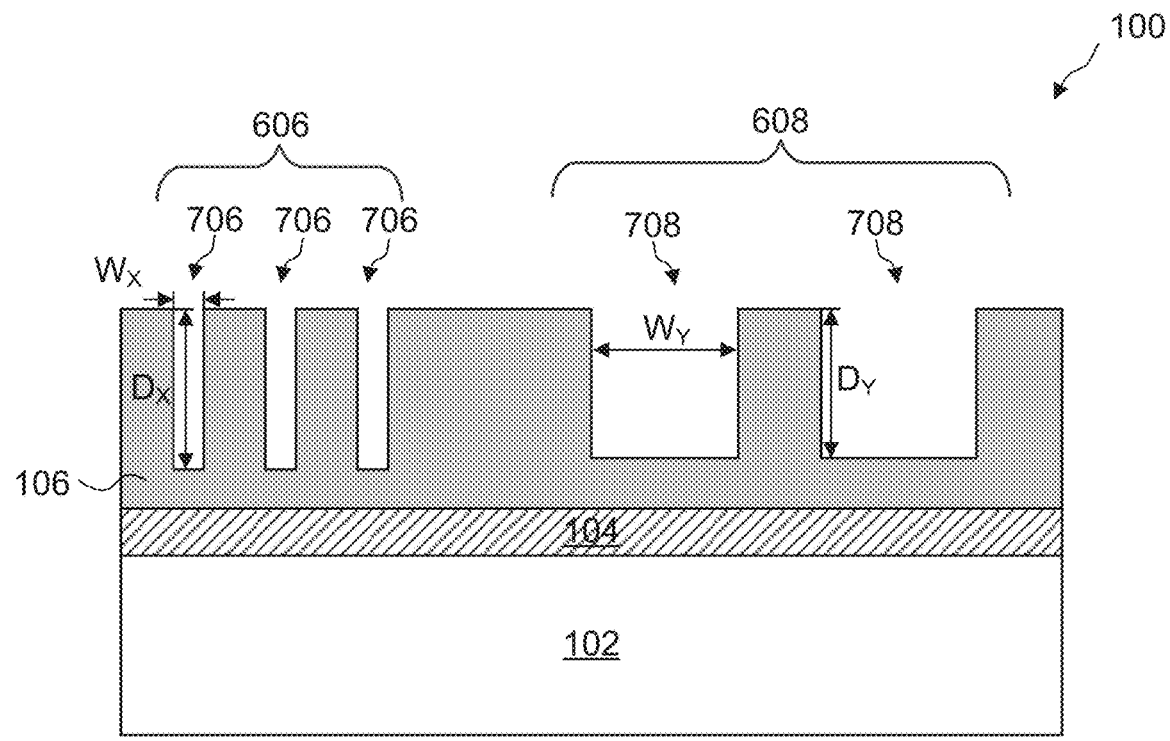
FIGS. 8A-8B are respective cross-sectional and isometric views of a semiconductor structure removing a multi-layer cap film, in accordance with some embodiments.
Figure 8B:
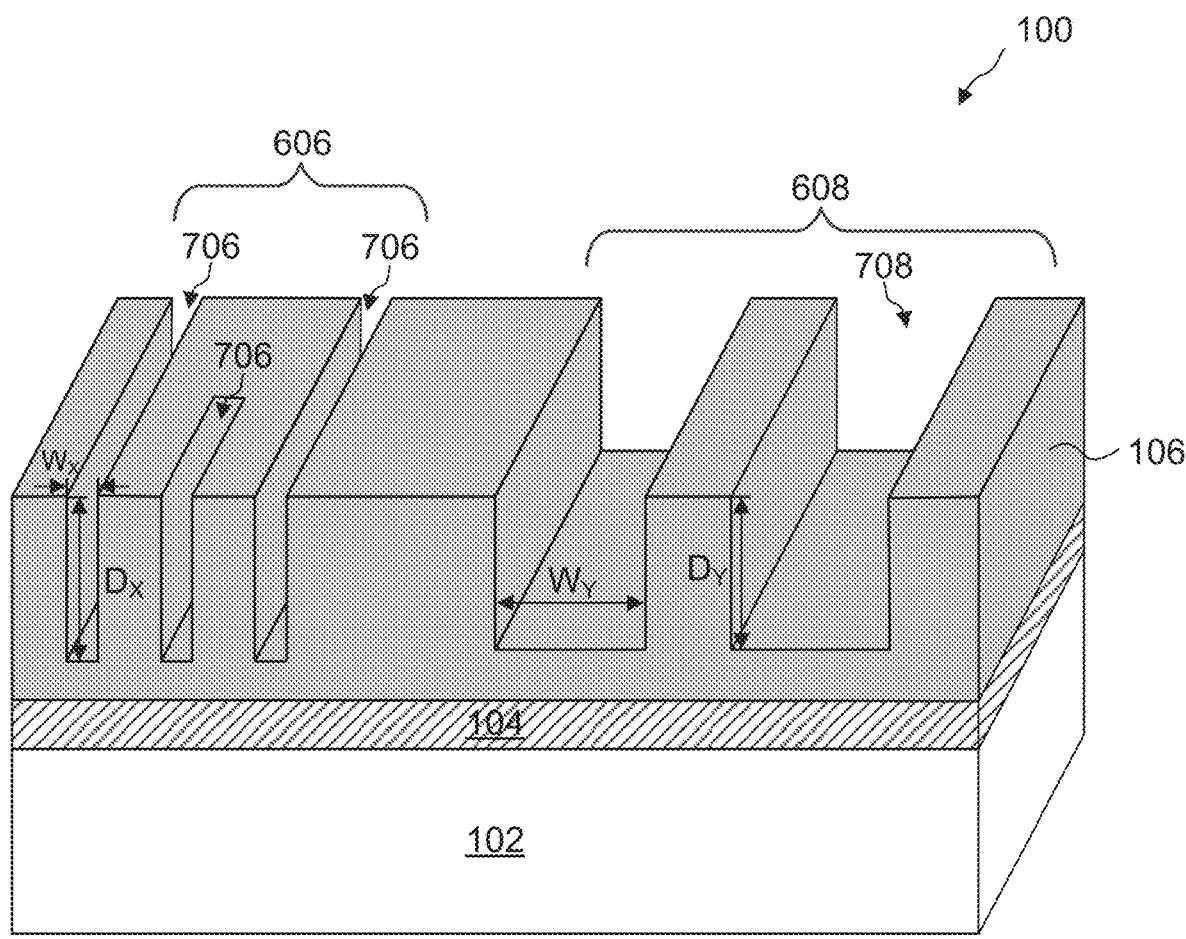

FIGS. 8A-8B are respective cross-sectional and isometric views of semiconductor structure 100 described above with reference to FIG. 7 after removing multi-layer cap film 201, in accordance with some embodiments of the present disclosure. Oxygen-based layer 202 and metal hard mask layer 206 of multi-layer cap film 201 can be removed using suitable processes such as, for example, dry etching, wet etching, reactive ion etching, and/or other etching methods. Any other suitable methods may alternatively be utilized such as, for example, a chemical mechanical polishing (CMP) process that can also planarize the remaining surfaces of dielectric layer 106.

Figure 9:
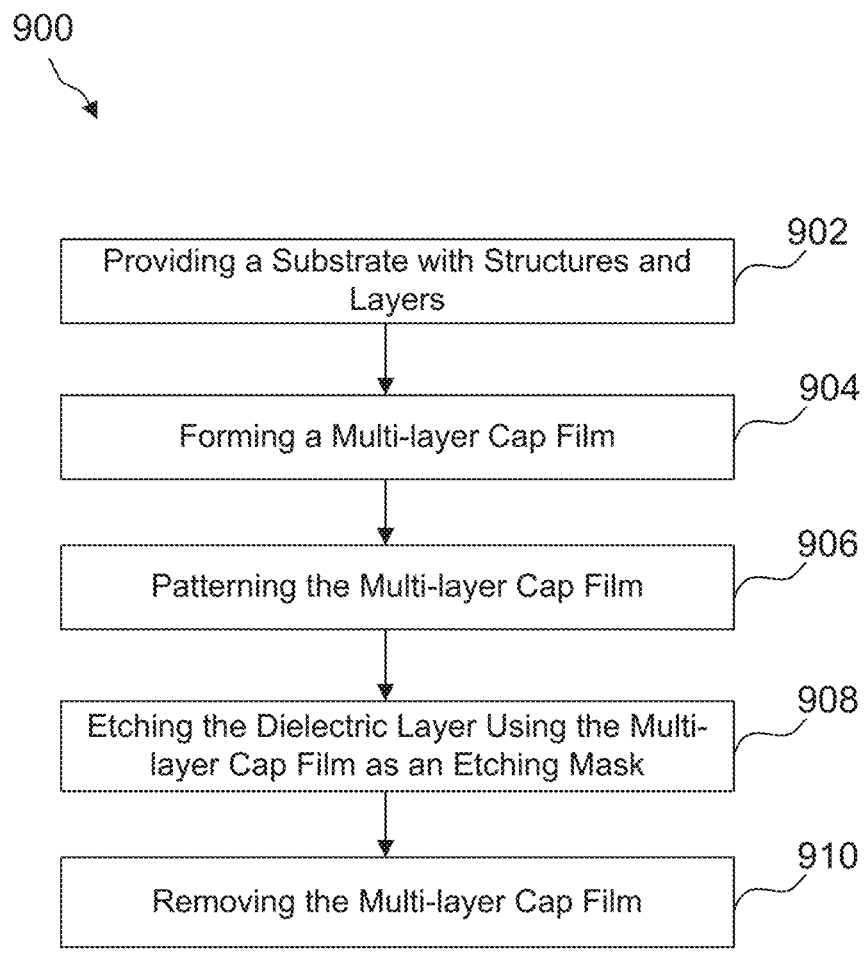
FIG. 9 is a flow diagram of an example method of reducing trench effect in semiconductor structures, in accordance with some embodiments.

FIG. 9 is a flow diagram of an example method 900 of reducing trench effect in semiconductor structures, in accordance with some embodiments of the present disclosure. Based on the disclosure herein, other operations in method 900 can be performed. Further, the operations of method 900 can be performed in a different order and/or vary.

At operation 902, structures and layers are formed on and/or within a semiconductor structure, in accordance with some embodiments. The semiconductor structure can include a substrate, one or more etch stop layers, and one or more dielectric layers. The semiconductor structure can also include other layers as needed. The substrate can be a silicon substrate, according to some embodiments. In some embodiments, the substrate can be (i) another semiconductor, such as germanium, (ii) a compound semiconductor including silicon carbide, gallium arsenide, gallium phosphide, indium phosphide, indium arsenide, GaAsP, AlInAs, AlGaAs, GaInAs, GaInP, GaInAsP, and/or indium antimonide; (iii) an alloy semiconductor including SiGe; or (iv) combinations thereof. In some embodiments, the substrate can be an SOI. In some embodiments, the substrate can be an epitaxial material. In some embodiments, the etch stop layer is formed on the substrate and can be used to prevent the etching of the substrate. The composition of the etch stop layer can be silicon nitride. Other exemplary compositions include $SiO_xN_y$, TiN, and/or other suitable materials. The deposition of the etch stop layer can be done by any suitable processes. The dielectric layer is made of a dielectric material and can be formed of silicon oxide, spin-on-glass, SiN, $SiO_xN_y$, FSG, a low-k dielectric material, and/or other suitable insulating material. Dielectric layer deposition can be done by any suitable processes. In some embodiments, the semiconductor structure can include capping layers, other etch stop layers, and/or other suitable materials. In some embodiments, the semiconductor structure can also include a processed integrated circuit wafer containing such as, for example, a plurality of transistors configured to be CMOS circuits. In some embodiments, active and passive devices such as, for example, transistors, diodes, capacitors, resistors, inductors, and the like can be formed on and/or within the semiconductor substrate. In some embodiments, the semiconductor structure includes raised features such as, for example, fins. Fins can be fabricated using suitable processes including photolithography and etch processes.

At operation 904, a multi-layer cap film is deposited over the semiconductor structure, in accordance with some embodiments. The multi-layer cap film can include an oxygen-based layer and a metal hard mask layer. In some embodiments, the multi-layer cap film can also include other layers. Exemplary composition of the oxygen-based layer can include TEOS. The oxygen-based layer can be formed using suitable deposition processes such as, for example, a CVD deposition process. In some embodiments, the thickness of the oxygen-based layer is in a range from about 25 angstroms to about 250 angstroms. An exemplary composition of the metal hard mask layer can include, for example, TiN. The metal hard mask layer can be formed using suitable deposition processes such as, for example, a CVD deposition process. In some embodiments, the thickness of the metal hard mask layer is in a range from about 250 angstroms to about 350 angstroms.

At operation 906, the multi-layer cap film is patterned, in accordance with some embodiments. The patterning process can be an etching process that includes depositing a photoresist material on the metal hard mask, exposing and patterning the photoresist to expose the portions of the metal hard mask to be etched, and etching the exposed portions of the metal hard mask and the underlying oxygen-based layer. In some embodiments, exposed portions of the metal hard mask not protected by the photoresist is etched away and the underlying oxygen-based layer is partially etched away. In some embodiments, the exposed portions of metal hard mask and the underlying oxygen-based layer are removed. The etching process can include any suitable etching technique such as, for example, dry etching, wet etching, reactive ion etching, and/or other etching methods. The oxygen-based layer and the metal hard mask can also be separately removed in multiple steps using suitable processes.

Removing portions of the multi-layer cap film can form first regions and second regions in the remaining multi-layer cap film, in accordance with some embodiments. The first and second regions include different pattern densities across the semiconductor structure. In some embodiments, the first regions can include dense areas, while the second regions can include isolated areas. It should be noted that any relative comparison of "dense" and "isolated" is within the scope of the present disclosure.

In some embodiments, the first regions can be regions of the semiconductor structure where one or more features are separated from each other by a minimum design rule spacing such as, for example, a critical dimension of the utilized photolithography process. For example, the width separating adjacent trenches in the third regions formed in remaining multi-layer cap film can be less than about 10 nm. In some embodiments, the separation of adjacent trenches in the third regions can be in a range from about 10 nm to about 20 nm. An example of the first region is first region 206 described with reference to FIG. 3A.

In some embodiments, the second regions can include a region of the substrate where features are separated from each other by multiple times of a minimum or near-minimum design rule spacing such as, for example, multiple times of a critical dimension. For example, the width separating two adjacent trenches in the second regions formed in remaining multi-layer cap film can be approximately 60 nm. In some embodiments, the separation of adjacent trenches in the second regions is in a range from about 40 nm to about 70 nm. It should be noted that the ranges of trench separation in the remaining multi-layer cap film described herein are merely provided as an example, and can be selected based on product needs. An example of the second region is second region 208 described with reference to FIG. 3A.

Removing portions of the multi-layer cap film can also form third regions and fourth regions in the remaining multi-layer cap film, in accordance with some embodiments. The third and fourth regions include areas having structures with different feature sizes across the semiconductor structure. In some embodiments, the third regions can include areas having structures of smaller feature sizes, while the fourth regions can include areas having structures of larger feature sizes. However, it should be noted that any relative comparison of "smaller" and "larger" is within the scope of the present disclosure.

In some embodiments, the third regions can be a region of the substrate where one or more features have a width or length substantially equal to a minimum design rule spacing such as, for example, a critical dimension of the utilized photolithography process. For example, the width of trenches in the third regions formed in remaining multi-layer cap film can be less than about 10 nm. In some embodiments, the widths of trenches of the third regions can be in a range from about 10 nm to about 20 nm. An example of the third region is third region 606 described with reference to FIG. 6A. It should be noted that the ranges of trench widths in the remaining multi-layer cap film described herein are merely provided as an example, and can be selected based on product needs.

In some embodiments, the fourth regions can include a region of the substrate where features have a width or length that substantially equals to multiple times of a minimum or near-minimum design rule spacing such as, for example, multiple times of a critical dimension. For example, the width of trenches in the fourth regions formed in remaining multi-layer cap film can be approximately 60 nm. In some embodiments, the width of trenches of the fourth regions is in a range from about 40 nm to about 70 nm. An example of the fourth region is fourth region 608 described with reference to FIG. 6A. It should be noted that the ranges of trench widths in the remaining multi-layer cap film described herein are merely provided as an example, and can be selected based on product needs.

At operation 908, the dielectric layer is etched using the multi-layer cap film as an etching mask, in accordance with some embodiments. Portions of the dielectric layer that are not protected by the metal hard mask and the oxygen-based layer are etched to form first, second, third, and fourth recesses in the respective first, second, third, and fourth regions, in accordance with some embodiments. Therefore, the patterns formed by the remaining multi-layer cap film can be transferred to the dielectric layer by the etching process. The formed recesses has the same width as the feature separations in the first or second regions, or has the same width as the trenches in the third or fourth regions. The etching processes can be plasma etching processes such as, for example, an RIE process using oxygen based plasma. In some embodiments, the RIE etching process may include other etchant gas such as, for example, nitrogen, $CF_4$ and/or other suitable gases. Numerous other methods to form recesses in the dielectric layer can also be suitable.

Incorporating oxygen-based layers can increase the etching rate of dielectric materials. For example, during an RIE process that uses oxygen as the etchant gas, the oxygen-based layer can release oxygen ions into the recesses and enhance the plasma etching process, resulting in an increased etching rate of the dielectric layer. The increase of etching rates is more effective in dense areas or areas with structures having smaller feature sizes such as, for example, the first and third regions. Examples of the first and third regions include first region 206 in FIG. 3A and third region 606 in FIG. 6A, respectively. Incorporating the oxygen-based layer releases oxygen ions into the recesses during the etching process, thereby increasing the supply of oxygen ions. This in turn increases the etching rate of the dielectric layer. The first and third recesses formed by the etching process can have an etching depth in a range of about 435 angstroms to about 485 angstroms. Examples of the first and third recesses include first recess 406 in FIG. 4 and third recess 706 in FIG. 7, respectively. The etching depth of the first and third recesses depends on, for example, device specifications and can be adjusted by tuning etch conditions (e.g., etching time, chamber pressure, gas flow rate, plasma power, voltage biases, and/or other suitable parameters).

Incorporating the oxygen-based layer can also affect etching rates of dielectric material in isolated areas or areas with structures having larger feature sizes such as, for example, the second and fourth regions. Examples of the second and fourth regions include second region 208 in FIG. 3A and fourth region 608 in FIG. 6A, respectively. Depending on the structure density and the etching condition, the etching rate can increase, decrease, or remain the same. In some embodiments incorporating the oxygen based-layer can increase the etching rate of the dielectric layer. In contrast, incorporating the oxygen based-layer may reduce the etching rate of the dielectric layer due to excessive supply of oxygen ions. However, in some embodiments, incorporating oxygen-based layer may not have a significant effect on the etching rate of dielectric layers. Second and fourth recesses formed by the etching process can have an etching depth in a range of about 450 angstroms to about 500 angstroms. Examples of the second and fourth recesses include second recess 408 in FIG. 4 and fourth recess 708 in FIG. 7, respectively. It should also be noted that the range described herein is provided as an example and the etching depth of second and fourth recesses depends on, for example, device specifications and can be adjusted by tuning etch conditions (e.g., etching time, chamber pressure, gas flow rate, plasma power, voltage biases, and/or other suitable parameters).

At operation 910, the multi-layer cap film can be removed, in accordance with some embodiments. The oxygen-based layer and the metal hard mask layer of the multi-layer cap film can be removed using suitable processes such as, for example, dry etching, wet etching, reactive ion etching, and/or other etching methods. Any other suitable methods may alternatively be utilized such as, for example, a CMP process that can also planarize the remaining surfaces of the dielectric layer.

Various embodiments in accordance with this disclosure provide methods of reducing trench loading effect in semiconductor structures. Incorporating oxygen-based layer can affect etching rates of dielectric material in dense and isolated areas or areas with small or large feature sizes. More specifically, the etching rate of the dielectric layer can increase in dense areas or areas of structures having smaller feature sizes. The etching rate in those areas can be increased such that it can be similar or equal to the etching rate in isolated areas or areas of structures having larger feature sizes. The difference between the etching depths in these areas can be less than about 20 angstroms and as low as zero, in accordance with some embodiments. The structure separations in the dense areas or the size of the smaller features can be as low as a minimum design rule spacing such as a critical dimension. The ranges described herein are provided as an example and the incorporation of oxygen-based layer can provide similar etching rate of dielectric material in dense and isolated areas or areas of structures having smaller or larger features, thereby reducing the trench loading effect in semiconductor structures.

In some embodiments, a semiconductor structure includes a dielectric layer formed over a substrate. An oxygen-based layer is formed over the dielectric layer. The semiconductor structure can also include first and second trenches formed in the dielectric layer using the oxygen-based layer as a mask. A width of the second trench can be larger than a width of the first trench and a depth of the second trench can be substantially equal to a depth of the first trench.

In some embodiments, a method of forming a semiconductor structure includes forming a dielectric layer over a substrate and depositing a tetraethyl orthosilicate (TEOS) layer over the dielectric layer. A metal hard mask layer can be deposited over the TEOS layer. The metal hard mask layer and the TEOS layer can be patterned. The method also includes forming first and second trenches by etching the dielectric layer using the patterned hard mask layer and the TEOS layer as masks.

In some embodiments, a semiconductor structure includes a dielectric layer formed over a substrate and a tetraethyl orthosilicate (TEOS) layer formed over the dielectric layer. First and second trenches can be formed in the dielectric layer using the TEOS layer as a mask. A width of the first trench can be substantially equal to a critical dimension of a utilized photolithography process and a width of the second trench can be larger than the width of the first trench.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method of fabricating a semiconductor structure, the method comprising:
   forming an etch stop layer on a substrate;
   forming a dielectric layer on the etch stop layer;
   depositing a tetraethyl orthosilicate (TEOS) layer over the dielectric layer;
   depositing a metal hard mask layer over the TEOS layer;
   patterning the metal hard mask layer and the TEOS layer;
   etching the dielectric layer using the patterned metal hard mask layer and the TEOS layer as masks to form first and second pluralities of trenches within the dielectric layer, wherein the first and second pluralities of trenches are respectively etched using first and second etching rates and a portion of the dielectric layer is between the etch stop layer and bottom surfaces of the first or second plurality of trenches, wherein:
      the first and second pluralities of trenches have respective first and second pattern densities that are different and
      respective first and second depths that are different and within about 5% of each other;
   increasing the first etching rate and reducing the second etching rate by releasing oxygen ions from the TEOS layer into the first and second pluralities of trenches, respectively;
   removing the TEOS layer and the metal hard mask layer; and
   performing a planarization process on the etched dielectric layer.

2. The method of claim 1, wherein an aspect ratio of each trench of the first plurality of trenches is greater than about 1.

3. The method of claim 1, wherein a first width of the first plurality of trenches is greater than a second width of the second plurality of trenches, and a difference between the first and second widths is larger than about 40 nm.

4. The method of claim 1, wherein patterning the metal hard mask layer and the TEOS layer comprises performing a first etching process to etch through the metal hard mask layer and remove a first portion of the TEOS layer without exposing the dielectric layer.

5. The method of claim 4, wherein patterning the metal hard mask layer and the TEOS layer further comprises performing a second etching process to remove a second portion of the TEOS layer and expose the dielectric layer.

6. The method of claim 1, wherein an aspect ratio of the first plurality of trenches is greater than an aspect ratio of the second plurality of trenches.

7. The method of claim 1, wherein etching the dielectric layer comprises a reactive ion etching (RIE) process.

8. The method of claim 7, wherein the RIE process comprises an oxygen-based plasma.

9. The method of claim 7, wherein etching gas of the RIE process comprises nitrogen or carbon tetrafluoride.

10. A method for forming a semiconductor structure, the method comprising:
  depositing a tetraethyl orthosilicate (TEOS) layer over a dielectric layer;
  depositing a hard mask layer over the TEOS layer;
  patterning the hard mask layer and the TEOS layer;
  etching the dielectric layer using the patterned hard mask layer and the TEOS layer as masks to form first and second pluralities of trenches within the dielectric layer, wherein the first and second pluralities of trenches are respectively etched using first and second etching rates, and wherein:
    widths of the first plurality of trenches are greater than widths of the second plurality of trenches and
    respective first and second depths of first and second pluralities of trenches are different and within about 5% of each other;
  increasing the first etching rate and reducing the second etching rate by releasing oxygen ions from the TEOS layer into the first and second pluralities of trenches, respectively;
  removing the TEOS layer and the hard mask layer; and
  performing a planarization process on the etched dielectric layer.

11. The method of claim 10, wherein an aspect ratio of each trench of the first plurality of trenches is greater than about 1.

12. The method of claim 10, wherein a difference between the widths of the first and second pluralities of trenches is larger than about 40 nm.

13. The method of claim 10, further comprising:
  depositing an etch stop layer on a substrate; and
  depositing the dielectric layer on the etch stop layer.

14. The method of claim 13, wherein a portion of the dielectric layer is between the etch stop layer and bottom surfaces of the first or second plurality of trenches.

15. The method of claim 10, wherein depositing the hard mask layer comprises depositing a metal hard mask material.

16. A method for forming a semiconductor structure, the method comprising:
  depositing a tetraethyl orthosilicate (TEOS) layer over a dielectric layer;
  depositing a hard mask layer over the TEOS layer;
  patterning the hard mask layer and the TEOS layer;
  etching the dielectric layer using the patterned hard mask layer and the TEOS layer as masks to form first and second pluralities of trenches within the dielectric layer, wherein the first and second pluralities of trenches are respectively etched using first and second etching rates, and wherein:
    the first and second pluralities of trenches have respective first and second pattern densities that are different and
    respective first and second depths that are different and within about 5% of each other; and
  increasing the first etching rate and reducing the second etching rate by releasing oxygen ions from the TEOS layer into the first and second pluralities of trenches, respectively.

17. The method of claim 16, wherein an aspect ratio of each trench of the first plurality of trenches is greater than about 1.

18. The method of claim 16, wherein a difference between widths of the first and second pluralities of trenches is larger than about 40 nm.

19. The method of claim 16, further comprising:
  depositing an etch stop layer on a substrate; and
  depositing the dielectric layer on the etch stop layer.

20. The method of claim 19, wherein a portion of the dielectric layer is between the etch stop layer and bottom surfaces of the first or second plurality of trenches.

* * * * *